United States Patent
Ohashi et al.

(10) Patent No.: US 9,793,131 B2
(45) Date of Patent: Oct. 17, 2017

(54) PATTERN FORMING METHOD USING RESIST UNDERLAYER FILM

(71) Applicant: NISSAN CHEMICAL INDUSTRIES, LTD., Tokyo (JP)

(72) Inventors: Tomoya Ohashi, Toyama (JP); Shigeo Kimura, Toyama (JP); Yuki Usui, Toyama (JP); Hiroto Ogata, Toyama (JP)

(73) Assignee: NISSAN CHEMICAL INDUSTRIES, LTD., Tokyo (JP)

( * ) Notice: Subject to any disclaimer, the term of this patent is extended or adjusted under 35 U.S.C. 154(b) by 0 days.

(21) Appl. No.: 14/914,160

(22) PCT Filed: Aug. 27, 2014

(86) PCT No.: PCT/JP2014/072449
§ 371 (c)(1),
(2) Date: Feb. 24, 2016

(87) PCT Pub. No.: WO2015/030060
PCT Pub. Date: Mar. 5, 2015

(65) Prior Publication Data
US 2016/0218013 A1  Jul. 28, 2016

(30) Foreign Application Priority Data
Aug. 28, 2013  (JP) ................ 2013-176378

(51) Int. Cl.
| | |
|---|---|
| *H01L 21/308* | (2006.01) |
| *H01L 21/311* | (2006.01) |
| *G03F 7/40* | (2006.01) |
| *C08F 220/32* | (2006.01) |
| *G03F 7/038* | (2006.01) |
| *G03F 7/09* | (2006.01) |
| *H01L 21/027* | (2006.01) |
| *H01L 21/306* | (2006.01) |
| *C08F 8/14* | (2006.01) |

(52) U.S. Cl.
CPC ........ *H01L 21/3086* (2013.01); *C08F 220/32* (2013.01); *G03F 7/038* (2013.01); *G03F 7/094* (2013.01); *G03F 7/40* (2013.01); *H01L 21/0273* (2013.01); *H01L 21/30604* (2013.01); *H01L 21/31111* (2013.01); *H01L 21/31138* (2013.01); *H01L 21/31144* (2013.01); *C08F 8/14* (2013.01)

(58) Field of Classification Search
None
See application file for complete search history.

(56) References Cited

U.S. PATENT DOCUMENTS

| | | | | |
|---|---|---|---|---|
| 7,794,919 | B2 * | 9/2010 | Kishioka | ........ C08G 59/40 430/271.1 |
| 8,501,393 | B2 * | 8/2013 | Hatanaka | ........ G03F 7/0392 430/270.1 |
| 9,123,655 | B2 * | 9/2015 | Oh | ........ H01L 21/3086 |
| 2008/0032231 | A1 * | 2/2008 | Hatakeyama | ........ G03F 7/094 430/270.1 |
| 2011/0039207 | A1 * | 2/2011 | Hirano | ........ G03F 7/0382 430/285.1 |
| 2012/0301828 | A1 | 11/2012 | Tachibana et al. | |
| 2014/0363958 | A1 * | 12/2014 | Hatakeyama | ........ G03F 7/094 438/514 |

FOREIGN PATENT DOCUMENTS

| | | |
|---|---|---|
| JP | S62-20326 A | 1/1987 |
| JP | 4145972 B2 | 9/2008 |
| JP | 2011-197425 A | 10/2011 |
| JP | 2012-247777 A | 12/2012 |
| JP | 2013-033942 A | 2/2013 |
| WO | 2005/013601 A1 | 2/2005 |

OTHER PUBLICATIONS

Dated Oct. 7, 2014 Written Opinion of the International Searching Authority issued in International Patent Application No. PCT/JP2014/072449.
Dated Oct. 7, 2014 International Search Report issued in International Patent Application No. PCT/JP2014/072449.

\* cited by examiner

*Primary Examiner* — Shamim Ahmed
(74) *Attorney, Agent, or Firm* — Oliff PLC

(57) ABSTRACT

A pattern forming method which uses a resist underlayer film having resistance to a basic aqueous hydrogen peroxide solution. A pattern forming method including: a first step of applying a resist underlayer film-forming composition containing a solvent and a polymer having a weight average molecular weight of 1,000 to 100,000 and an epoxy group on a semiconductor substrate that may have an inorganic film on the surface, followed by baking, to form a resist underlayer film; a second step of forming a resist pattern on the resist underlayer film; a third step of dry etching the resist underlayer film using the resist pattern as a mask to expose a surface of the inorganic film or the semiconductor substrate; and a fourth step of wet etching the inorganic film or the semiconductor substrate using the dry-etched resist underlayer film as a mask and a basic aqueous hydrogen peroxide solution.

8 Claims, No Drawings

PATTERN FORMING METHOD USING RESIST UNDERLAYER FILM

TECHNICAL FIELD

The present invention relates to a pattern forming method which uses a resist underlayer film having excellent resistance to a basic aqueous hydrogen peroxide solution.

BACKGROUND ART

A lithography process in which a resist underlayer film is provided between a substrate and a resist film formed on the substrate, and a resist pattern of desired shape is formed has been known. However, a conventional resist underlayer film, for example, a resist underlayer film formed from a composition containing an aminoplast crosslinker, described in Patent Document 1, has poor resistance to a basic aqueous hydrogen peroxide solution. Therefore, such a resist underlayer film cannot be used as a mask in an etching process using the basic aqueous hydrogen peroxide solution.

Patent Document 2 describes an underlayer film-forming composition for lithography containing a compound having a protected carboxyl group, a compound having a group capable of reacting with a carboxyl group, and a solvent, or an underlayer film-forming composition for lithography containing a compound having a group capable of reacting with a carboxyl group and a protected carboxyl group and a solvent. The compositions do not contain an aminoplast crosslinker as an essential component. However, Patent Document 2 does not describe or suggest resistance of resist underlayer films formed from the compositions to the basic aqueous hydrogen peroxide solution.

PRIOR ART DOCUMENTS

Patent Documents

Patent Document 1: Japanese Patent No. 4145972
Patent Document 2: International Publication WO 2005/013601

SUMMARY OF THE INVENTION

Problem to be Solved by the Invention

It is an object of the present invention to provide a pattern forming method which uses a resist underlayer film having resistance to a basic aqueous hydrogen peroxide solution.

Means for Solving the Problems

A first aspect of the present invention is a pattern forming method comprising: a first step of applying a resist underlayer film-forming composition containing a solvent and a polymer having a weight average molecular weight of 1,000 to 100,000 and an epoxy group on a semiconductor substrate that may have an inorganic film on the surface, followed by baking, to form a resist underlayer film; a second step of forming a resist pattern on the resist underlayer film; a third step of dry etching the resist underlayer film using the resist pattern as a mask to expose a surface of the inorganic film or the semiconductor substrate; and a fourth step of wet etching the inorganic film or the semiconductor substrate using the dry-etched resist underlayer film as a mask and a basic aqueous hydrogen peroxide solution.

The polymer may be a copolymer or a homopolymer.

The polymer can further have a protected carboxyl group and/or an absorption moiety exhibiting absorption at a wavelength of 193 nm or an absorption moiety exhibiting absorption at a wavelength of 248 nm.

Examples of the protected carboxyl group include an esterified carboxyl group. In particular, a carboxyl group that is esterified using a compound having a vinyl ether group is often used. This is because carboxylic acid can be generated in a simple manner by heating the compound having a vinyl ether group to detach the vinyl ether group. For a carboxyl group esterified using a compound other than the compound having a vinyl ether group, carboxylic acid can be generated by selecting appropriate condition. Therefore, it is not limited to only the vinyl ether group to be used for esterification.

Examples of the absorption moiety exhibiting absorption at a wavelength of 193 nm include a benzene ring, a naphthalene ring, and a triazine ring. Examples of the absorption moiety exhibiting absorption at a wavelength of 248 nm include a naphthalene ring, an anthracene ring, a pyrene ring, and a triazine ring.

The resist underlayer film-forming composition can further contain one or two or more of polymers selected from the group consisting of a polymer having a protected carboxyl group, a polymer having an absorption moiety exhibiting absorption at a wavelength of 193 nm, and a polymer having an absorption moiety exhibiting absorption at a wavelength of 248 nm.

The resist underlayer film-forming composition can further contain as a crosslinker, a compound having one or two or more groups selected from the group consisting of an epoxy group, an oxetanyl group, a carboxyl group, a thiol group, and a phenyl group.

The inorganic film includes, for example, one or two or more selected from the group consisting of a polysilicon film, a silicon oxide film, a silicon nitride film, a Borophospho Silicate Glass (BPSG) film, a titanium nitride film, a titanium oxynitride film, a tungsten film, a gallium nitride film, and a gallium arsenide film.

The basic aqueous hydrogen peroxide solution contains, for example, ammonia, sodium hydroxide, potassium hydroxide, sodium cyanide, potassium cyanide, triethanolamine, or urea. When the basic aqueous hydrogen peroxide solution contains ammonia, the basic aqueous hydrogen peroxide solution is a mixture of 25% by mass to 30% by mass of aqueous ammonia solution (A), 30% by mass to 36% by mass of aqueous hydrogen peroxide solution (B), and water (C), and the volume ratio (B)/(A) of the aqueous hydrogen peroxide solution (B) to the aqueous ammonia solution (A) is 0.1 to 20.0, and the volume ratio (C)/(A) of water (C) to the aqueous ammonia solution (A) is 5.0 to 50.0.

Effects of the Invention

The resist underlayer film formed at the first step in the pattern forming method of the present invention can be used as a mask in an etching process using the basic aqueous hydrogen peroxide solution. This is because the resist underlayer film has resistance to the basic aqueous hydrogen peroxide solution. In addition, the resist pattern on the resist underlayer film is unlikely to be separated from the semiconductor substrate even under exposure to the basic aqueous hydrogen peroxide solution.

MODES FOR CARRYING OUT THE INVENTION

Hereinafter, the resist underlayer film-forming composition used in the pattern forming method of the present invention will be described.

The weight average molecular weight of the polymer contained in the resist underlayer film-forming composition is a value determined by gel permeation chromatography (GPC) using polystyrene as a standard sample. When the value is less than 1,000, the resistance of the resist underlayer film to be formed to a resist solvent may be insufficient.

As a crosslinker that is contained as optional component in the resist underlayer film-forming composition and is a compound having one or two or more groups selected from the group consisting of an epoxy group, an oxetanyl group, a carboxyl group, a thiol group, and a phenyl group, examples of the crosslinker include a compound having at least two epoxy groups including tris(2,3-epoxypropyl) isocyanurate, 1,4-butanediol diglycidyl ether, 1,2-epoxy-4-(epoxyethyl)cyclohexane, glycerol triglycidyl ether, diethylene glycol diglycidyl ether, 2,6-diglycidyl phenyl glycidyl ether, 1,1,3-tris[p-(2,3-epoxypropoxy)phenyl]propane, 1,2-cyclohexane dicarboxylic acid diglycidyl ester, 4,4'-methylene bis(N,N-diglycidyl aniline), 3,4-epoxycyclohexylmethyl-3,4-epoxycyclohexane carboxylate, trimethylol ethane triglycidyl ether, bisphenol-A-diglycidyl ether, EPOLEAD (registered trademark) GT-401, GT-403, GT-301, and GT-302, and CELLOXIDE (registered trademark) 2021 and 3000 manufactured by Daicel Corporation, 152, 154, 157S70, 168V70, 604, 630, 806, 807, 825, 827, 828, 834X90, 871, 872, 1001, 1002, 1003, 1004, 1007, 1009, 1010, 1031S, 1032H60, 1256, 4004P, 4005P, 4007P, 4010P, 4250, 4275, 5046B80, YL980, YL983U, YL6810, YL6121L, YX4000, YX4000H, YX7399, YX7700, YX8000, YX8034, and YX8800 manufactured by Mitsubishi Chemical Corporation, EPPN201, and 202, and EOCN-102, 103S, 104S, 1020, 1025, and 1027 manufactured by NIPPON KAYAKU Co., Ltd., Denacol (registered trademark) EX-252, EX-313, EX-314, EX-321, EX-411, EX-421, EX-512, EX-522, EX-611, EX-612, EX-614, and EX-622 manufactured by Nagase ChemteX Corporation, CY175, CY177, CY179, CY182, CY184, and CY192 manufactured by BASF Japan Ltd., EPICLON 200, 400, 7015, 830, 830-S, EXA-830CRP, EXA-830LVP, 835, EXA-835LV, 840, 840-S, 850, 850-S, EXA-850CRP, 1050, 1055, 2050, 3050, EXA-4816, EXA-4822, EXA-4850, HP-4032, HP-4032D, HP-4700, HP-4710, HP-4770, HP-5000, HP-7200, HP-7200L, HP-7200H, and HP-7200HH manufactured by DIC Corporation, and EpoTohto (registered trademark) YD-127, YD-128, YDF-170, YD-8125, YDF-8170C, ZX-1059, YD-825GS, YD-825GSH, YDF-870GS, YDPN-138, YDCN-700, YDC-1312, YSLV-80XY, YSLV-120TE, ST-3000, ST-4000D, YD-171, YH-434, YH-434L, FX-289BEK75, FX-305EK70, and ERF-001M30 manufactured by NIPPON STEEL & SUMIKIN CHEMICAL CO., LTD., and TEPIC (registered trademark)-G, S, SP, SS, HP, L, and VL manufactured by NISSAN CHEMICAL INDUSTRIES, LTD.

In addition, as the compound having at least two epoxy groups, a polymer having an epoxy group can be used. The polymer can be used without particular limitation as long as it is a polymer having an epoxy group. Such a polymer can be produced by addition polymerization using an addition-polymerizable monomer having an epoxy group or by a reaction of a polymer having a hydroxy group or a hydroxyphenyl group with a compound having an epoxy group such as epichlorohydrin and glycidyl tosylate. Examples thereof include addition polymerization polymers such as polyglycidyl acrylate, a copolymer of glycidyl methacrylate with ethyl methacrylate, and a copolymer of polyglycidyl acrylate, styrene, and 2-hydroxyethyl methacrylate, and condensation polymerization polymers such as epoxy novolac. The polymer has a weight average molecular weight of 300 to 200,000 in terms of polystyrene.

Examples of a compound having at least two oxetanyl groups include ARONE OXETANE (registered trademark) OXT-121 and OXT-221 manufactured by TOAGOSEI CO., LTD.

Examples of a compound having at least two thiol groups include THIOKOL (registered trademark) LP and LP-282 manufactured by Toray Fine Chemicals Co., Ltd., and KarenzMT (registered trademark) PE1, BD1, and NR1, and Karenz (registered trademark) TPMB and TEMB manufactured by Showa Denko K.K.

When the resist underlayer film-forming composition contains the crosslinker, the content thereof is, for example, 2 parts by mass to 60 parts by mass relative to the content of the polymer contained in the resist underlayer film-forming composition. When the compound having an epoxy group is used as the crosslinker, a resist underlayer film to be formed is unlikely to be separated from a semiconductor substrate. When the content of the crosslinker is too small or too large, the resistance of a film to be formed to a resist solvent may be insufficiently achieved.

In order to promote a cross-linking reaction, the resist underlayer film-forming composition may contain a cross-linking catalyst with the crosslinker. As the cross-linking catalyst, an acidic compound, a basic compound, or a compound that generates an acid or a base by heat can be used. As the acidic compound, a sulfonic acid compound or a carboxylic acid compound can be used. As the compound that generates an acid by heat, a thermal acid generator can be used. Examples of the sulfonic acid compound or the carboxylic acid compound include p-toluenesulfonic acid, trifluoromethanesulfonic acid, pyridinium p-toluenesulfonate, salicylic acid, camphorsulfonic acid, 5-sulfosalicylic acid, 4-chlorobenzenesulfonic acid, 4-hydroxybenzenesulfonic acid, pyridinium-4-hydroxybenzenesulfonic acid, benzenedisulfonic acid, 1-naphthalenesulfonic acid, 4-nitrobenzenesulfonic acid, citric acid, benzoic acid, and hydroxybenzoic acid. Examples of the thermal acid generator include K-PURE (registered trademark) CXC-1612, CXC-1614, TAG-2172, TAG-2179, TAG-2678, and TAG-2689 (manufactured by King Industries, Inc.), and SI-45, SI-60, SI-80, SI-100, SI-110, and SI-150 (manufactured by SANSHIN CHEMICAL INDUSTRY CO., LTD.). One of these cross-linking catalysts may be used or two or more thereof may be used in combination.

As the basic compound, an amine compound or an ammonium hydroxide compound can be used. As the compound that generates a base by heat, urea can be used. Examples of the amine compound include tertiary amines such as triethanolamine, tributanolamine, trimethylamine, triethylamine, tri-n-propylamine, triisopropylamine, tri-n-butylamine, tri-tert-butylamine, tri-n-octylamine, triisopropanolamine, phenyldiethanolamine, stearyldiethanolamine, and diazabicyclooctane, and aromatic amines such as pyridine and 4-dimethylaminopyridine. Additional examples of the amine compound include primary amines such as benzylamine and n-butylamine, and secondary amines such as diethylamine and di-n-butylamine. The amine compound may be used singly or two or more thereof may be used in combination. Examples of the ammonium hydroxide compound include tetramethylammonium hydroxide, tetraethylammonium hydroxide, tetrapropylammonium hydroxide, tetrabutylammonium hydroxide, benzyltrimethylammonium hydroxide, benzyltriethylammonium hydroxide, cetyltrimethylammonium hydroxide, phenyltrimethylammonium hydroxide, and phenyltriethylammonium hydroxide. As the compound that generates a base by heat, for example, a compound that has a thermally unstable group such as an amido group, a urethane group, and an aziridine group and produces an amine by heating can be used. In addition, examples of the compound that generates a base by heat include urea, benzyltrimethylammonium chloride, benzyltriethylammonium chloride, benzyldimetbylphenylammonium chloride, benzyldodecyldimethylammonium chloride, benzyltributylammonium chloride, and choline chloride.

When the resist underlayer film-forming composition contains the cross-linking catalyst, the content thereof is, for example, 0.2% by mass to 20% by mass relative to the content of the crosslinker.

The resist underlayer film-forming composition may contain a surfactant as an optional component to improve coating property to a semiconductor substrate. Examples of the surfactant include nonionic surfactants including polyoxyethylene alkyl ethers such as polyoxyethylene lauryl ether, polyoxyethylene stearyl ether, polyoxyethylene cetyl ether, and polyoxyethylene oleyl ether, polyoxyethylene alkyl aryl ethers such as polyoxyethylene octyl phenyl ether and polyoxyethylene nonyl phenyl ether, polyoxyethylene-polyoxypropylene block copolymers, sorbitan fatty acid esters such as sorbitan monolaurate, sorbitan monopalmitate, sorbitan monostearate, sorbitan monooleate, sorbitan trioleate, and sorbitan tristearate, and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate, and fluorosurfactants including EFTOP (registered trademark) EF301, EF303, and EF352 (manufactured by Mitsubishi Materials Electronic Chemicals Co., Ltd.), MEGAFACE (registered trademark) F171, F173, R-30, R-30N, R-40, and R-40-LM (manufactured by DIC Corporation), Fluorad FC430 and FC431 (manufactured by Sumitomo 3M, Ltd.), and Asahi Guard (registered trademark) AG710, and Surflon S-382. SC101, SC102, SC103, SC104, SC105, and SC106 (manufactured by Asahi Glass Co., Ltd.), and organosiloxane polymer KP341 (manufactured by Shin-Etsu Chemical Co., Ltd.). The surfactant may be used singly or two or more thereof may be used in combination.

When the resist underlayer film-forming composition contains the surfactant, the content thereof is, for example, 0.01% by mass to 10% by mass relative to the content of the polymer contained in the resist underlayer film-forming composition.

The resist underlayer film-forming composition can be prepared by dissolving the components in a solvent. The resist underlayer film-forming composition can be used in a homogeneous solution state. Examples of such a solvent include ethylene glycol monomethyl ether, ethylene glycol monoethyl ether, methyl cellosolve acetate, ethyl cellosolve acetate, diethylene glycol monomethyl ether, diethylene glycol monoethyl ether, propylene glycol, propylene glycol monoethyl ether, propylene glycol monomethyl ether, propylene glycol monomethyl ether acetate, propylene glycol propyl ether acetate, toluene, xylene, methyl ethyl ketone, methyl isobutyl ketone, cyclopentanone, cyclohexanone, cycloheptanone, 4-methyl-2-pentanol, methyl 2-hydroxyisobutyrate, ethyl 2-hydroxyisobutyrate, ethyl ethoxyacetate, 2-hydroxyethyl acetate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, butyl lactate, 2-heptanone, methoxycyclopentane, anisole, γ-butyrolactone, N-methylpyrrolidone, N,N-dimethyl formamide, and N,N-dimethyl acetamide. The solvent may be used singly or two or more thereof may be used in combination.

It is preferable that the prepared resist underlayer film-forming composition be used after filtration through a filter with a pore diameter of 0.2 μm or 0.1 μm and/or a filter with a pore diameter of 0.01 μm. The resist underlayer film-forming composition has excellent storage stability at room temperature for a long period.

Hereinafter, the pattern forming method using the resist underlayer film-forming composition of the present invention will be described.

Examples of a semiconductor substrate to which the resist underlayer film-forming composition is applied include a silicon wafer, a germanium wafer, and a semiconductor wafer of compound such as gallium arsenide, indium phosphide, gallium nitride, indium nitride, and aluminum nitride. When a semiconductor substrate having an inorganic film on the surface is used, the inorganic film is formed, for example, by a CVD method, a reactive sputtering method, an ion plating method, a vacuum evaporation method, or a spin coating method (Spin on glass: SOG). To such a semiconductor substrate, the resist underlayer film-forming composition is applied by an appropriate coating method such as a spinner and a coater. The substrate is then baked by a heating means such as a hot plate to form a resist underlayer film. A baking condition is appropriately selected from a baking temperature of 100° C. to 400° C. and a baking time of 0.3 minutes to 10 minutes. It is preferable that the baking temperature be 120° C. to 300° C. and the baking time be 0.5 minutes to 5 minutes. For example, the formed resist underlayer film has a thickness of 0.001 μm to 1 μm, and preferably 0.002 μm to 0.5 μm. When the temperature during baking is lower than the above-described range, cross-linking is insufficient, intermixing may occur between the resist underlayer film and a resist to be formed as an upper layer. In contrast, when the temperature during baking is higher than the above-described range, the resist underlayer film may be thermally decomposed.

Subsequently, a resist pattern is formed on the resist underlayer film. The resist pattern can be formed by a general method, that is, by applying a photoresist solution to the resist underlayer film, followed by prebaking, exposure, post exposure baking abbreviated as PEB (if necessary), development, and rinsing. The photoresist solution used to form the resist pattern is not particularly limited as long as it can be sensitive to light used in exposure, and a positive photoresist can be used. Examples thereof include a chemically amplified photoresist including a binder having a group that increases an alkali dissolution rate by decomposition with an acid and a photoacid generator, a chemically amplified photoresist including a low molecular compound that increases an alkali dissolution rate of the photoresist by decomposition with an acid, an alkali-soluble binder, and a photoacid generator, and a chemically amplified photoresist including a binder having a group that increases an alkali dissolution rate by decomposition with an acid, a low molecular compound that increases the alkali dissolution rate of the photoresist by decomposition with the acid, and a photoacid generator. Specific examples thereof include trade name: PAR710 manufactured by Sumitomo Chemical Co., Ltd., trade name: TDUR-P3435LP manufactured by TOKYO OHKA KOGYO CO., LTD., and trade name: SEPR430 manufactured by Shin-Etsu Chemical Co., Ltd. A negative photoresist can be also used instead of the positive photoresist.

The exposure is carried out through a mask (reticle) for formation of a predetermined pattern. For example, a KrF excimer laser, an ArF excimer laser, extreme ultraviolet light (EUV), or electron beam (EB) can be used. In the development, an alkaline developer is used, a development temperature is appropriately selected from 5° C. to 50° C., and a development time is appropriately selected from 10 seconds to 300 seconds. Examples of the alkaline developer include an alkaline aqueous solution including an aqueous solution of an alkali metal hydroxide such as potassium hydroxide and sodium hydroxide, an aqueous solution of a quaternary ammonium hydroxide such as tetramethylammonium hydroxide, tetraethylammonium hydroxide, and choline, and an aqueous solution of an amine such as ethanolamine, propylamine, and ethylenediamine. Further, a surfactant or the like can be added to the developer. A method in which a portion where the alkali dissolution rate of the photoresist is not enhanced is developed using an organic solvent such as butyl acetate instead of the alkaline developer can be used.

Subsequently, the resist underlayer film is dry etched using the formed resist pattern as a mask. In this case, when the inorganic film is formed on the surface of the used semiconductor substrate, the surface of the inorganic film is exposed. When the inorganic film is not formed on the surface of the semiconductor substrate, the surface of the semiconductor substrate is exposed.

The inorganic film or the semiconductor substrate is wet etched using the dry etched resist underlayer film (including the resist pattern when the resist pattern remains on the resist underlayer film) as a mask and a basic aqueous hydrogen peroxide solution, to form a desired pattern. Examples of chemical solution for wet etching include aqueous basic hydrogen peroxide solutions obtained by mixing a basic substance, for example, sodium hydroxide, potassium hydroxide, ammonia, sodium cyanide, potassium cyanide, or an organic amine such as triethanolamine with hydrogen peroxide solution, and then adjusting the resulting mixture to a basic pH. Further, a substance capable of obtaining a basic pH, for example, a substance that finally obtains a basic pH by mixing urea and hydrogen peroxide, and causing thermal decomposition of urea by heating, to generate ammonia can be used as the chemical solution for wet etching. It is desirable that the use temperature of the basic aqueous hydrogen peroxide solution be 25° C. to 90° C., and preferably 40° C. to 80° C. It is desirable that the wet etching time be 0.5 minutes to 30 minutes, and preferably 1 minute to 20 minutes.

EXAMPLES

Hereinafter, the present invention will be described in more detail with reference to Examples, but the present invention is not limited to Examples.

Devices used in measurement of weight average molecular weights of polymers obtained in the following Synthesis Examples are as follows.
Device: HLC-8220GPC manufactured by Tosoh Corporation
GPC column: Shodex (registered trademark) KF-803L, KF-802, and KF-801
Column temperature: 40° C.
Flow rate: 0.2 mL/min
Eluent: THF
Standard sample: polystyrene (Tosoh Corporation)

Synthesis Example 1

To a solution obtained by adding 2.31 g of 1-butoxyethyl methacrylate of Formula (1), 2.07 g of glycidyl methacrylate of Formula (2), 4.01 g of methyl methacrylate of Formula (3), and 1.61 g of 9-anthrylmethyl methacrylate of Formula (4) to 24.50 g of propylene glycol monomethyl ether acetate, nitrogen was supplied for 30 minutes, and the solution was heated to 80° C. While the temperature of the solution was kept to 80° C., 0.50 g of dimethyl 2,2'-azobis(isobutyrate) was added to the solution. The mixture was stirred at 80° C. under a nitrogen atmosphere for 8 hours to obtain a solution containing a copolymer of 1-butoxyethyl methacrylate, glycidyl methacrylate, methyl methacrylate, and 9-anthrylmethyl methacrylate. The obtained copolymer was analyzed by GPC. The weight average molecular weight (in terms of standard polystyrene) was 6,500.

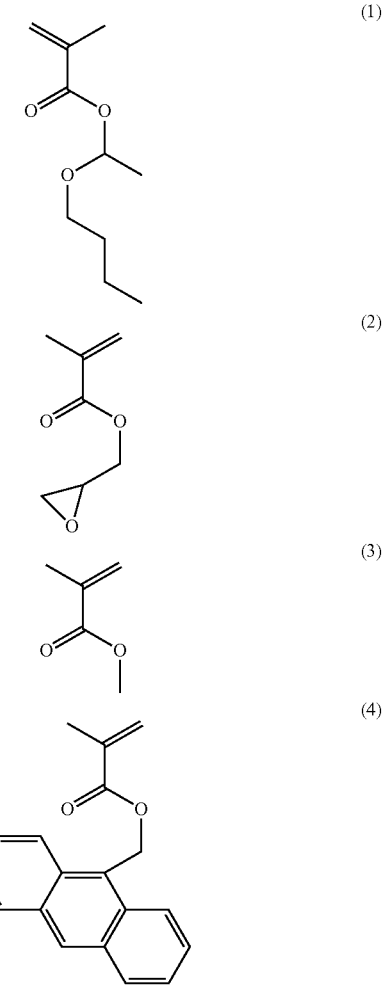

Synthesis Example 2

To a solution obtained by adding 2.51 g of 1-butoxyethyl methacrylate of Formula (1), 3.84 g of glycidyl methacrylate of Formula (2), 2.16 g of methyl methacrylate of Formula (3), and 1.49 g of 9-anthrylmethyl methacrylate of Formula (4) to 24.50 g of propylene glycol monomethyl ether acetate, nitrogen was supplied for 30 minutes, and the solution was heated to 80° C. While the temperature of the solution was kept to 80° C., 0.50 g of dimethyl 2,2'-azobis(isobutyrate) was added to the solution. The mixture was stirred at 80° C. under a nitrogen atmosphere for 8 hours to obtain a solution containing a copolymer of 1-butoxyethyl methacrylate, glycidyl methacrylate, methyl methacrylate, and 9-anthrylmethyl methacrylate. The obtained copolymer was analyzed by GPC. The weight average molecular weight (in terms of standard polystyrene) was 15,000.

Synthesis Example 3

To a solution obtained by adding 1.19 g of 1-butoxyethyl methacrylate of Formula (1), 0.91 g of glycidyl methacrylate of Formula (2), and 7.90 g of 2-vinylnaphthalene of Formula (5) to 24.50 g of cyclohexanone, nitrogen was supplied for 30 minutes, and the solution was heated to 80° C. While the temperature of the solution was kept to 80° C., 0.50 g of dimethyl 2,2'-azobis(isobutyrate) was added to the solution. The mixture was stirred at 80° C. under a nitrogen atmosphere for 8 hours to obtain a solution containing a copolymer of 1-butoxyethyl methacrylate, glycidyl methacrylate, and 2-vinylnaphthalene. The obtained copolymer was analyzed by GPC. The weight average molecular weight (in terms of standard polystyrene) was 6,000.

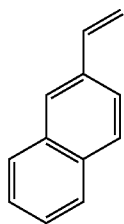

(5)

Synthesis Example 4

34.68 g of glycidyl methacrylate and 65.32 g of 2-hydroxypropyl methacrylate were dissolved in 404.00 g of propylene glycol monomethyl ether, and the mixture was heated. While the temperature of the mixture was kept to 70° C., 1.00 g of azobisisobutyronitrile was added to cause a reaction for 24 hours. As a result, a solution of copolymer of glycidyl methacrylate with 2-hydroxypropyl methacrylate was obtained. The obtained copolymer was analyzed by GPC. The weight average molecular weight in terms of standard polystyrene was about 50,000. To 100 g of solution containing 20 g of this copolymer, 9.88 g of 9-anthracenecarboxylic acid, 0.25 g of benzyltriethylammonium chloride, and 40.52 g of propylene glycol monomethyl ether were added, and the mixture was heated to cause a reaction at 120° C. for 24 hours. As a result, a solution of copolymer having a structural unit of Formula (6) was obtained.

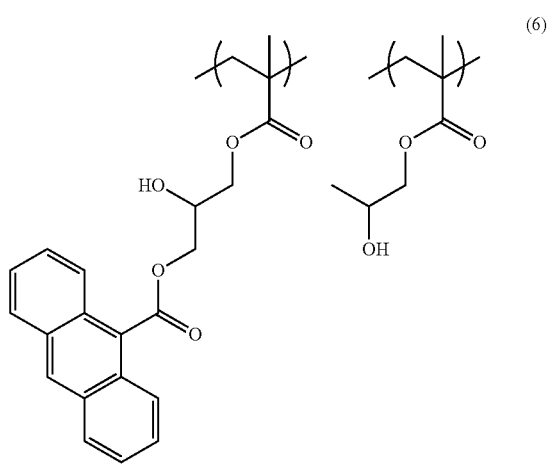

(6)

Synthesis Example 5

To a solution obtained by adding 10.00 g of 1-butoxyethyl methacrylate of Formula (1) to 24.50 g of propylene glycol monomethyl ether acetate, nitrogen was supplied for 30 minutes, and the solution was heated to 80° C. While the temperature of the solution was kept to 80° C., 0.50 g of dimethyl 2,2'-azobis(isobutyrate) was added to the solution. The mixture was stirred at 80° C. under a nitrogen atmosphere for 8 hours to obtain a solution containing a polymer of 1-butoxyethyl methacrylate. The obtained polymer was analyzed by GPC. The weight average molecular weight (in terms of standard polystyrene) was 11,300.

Synthesis Example 6

To a solution obtained by adding 10.00 g of glycidyl methacrylate of Formula (2) to 24.50 g of propylene glycol monomethyl ether acetate, nitrogen was supplied for 30 minutes, and the solution was heated to 80° C. While the temperature of the solution was kept to 80° C., 0.50 g of dimethyl 2,2'-azobis(isobutyrate) was added to the solution. The mixture was stirred at 80° C. under a nitrogen atmosphere for 8 hours to obtain a solution containing a polymer of glycidyl methacrylate. The obtained polymer was analyzed by GPC. The weight average molecular weight (in terms of standard polystyrene) was 11,900.

Preparation Example 1

To 10.67 g of solution containing 3.20 g of the copolymer obtained in Synthesis Example 1, 60.29 g of propylene glycol monomethyl ether acetate and 29.04 g of ethyl lactate were added to obtain a solution. After then, the solution was filtered through a microfilter made of polyethylene with a pore diameter of 0.01 μm to prepare a resist underlayer film-forming composition.

Preparation Example 2

To 10.67 g of solution containing 3.20 g of the copolymer obtained in Synthesis Example 2, 60.29 g of propylene glycol monomethyl ether acetate and 29.04 g of ethyl lactate were added to obtain a solution. After then, the solution was filtered through a microfilter made of polyethylene with a pore diameter of 0.01 μm to prepare a resist underlayer film-forming composition.

Preparation Example 3

To 8.25 g of solution containing 2.48 g of the copolymer obtained in Synthesis Example 1, 0.12 g of epoxy resin YH-434L manufactured by NIPPON STEEL & SUMIKIN CHEMICAL CO., LTD., 62.40 g of propylene glycol monomethyl ether acetate, and 29.22 g of propylene glycol monomethyl ether were added to obtain a solution. After then, the solution was filtered through a microfilter made of polyethylene with a pore diameter of 0.01 μm to prepare a resist underlayer film-forming composition.

Preparation Example 4

To 7.22 g of solution containing 2.17 g of the copolymer obtained in Synthesis Example 1, 0.43 g of epoxy resin YH-434L manufactured by NIPPON STEEL & SUMIKIN CHEMICAL CO., LTD., 63.12 g of propylene glycol monomethyl ether acetate, and 29.22 g of propylene glycol monomethyl ether were added to obtain a solution. After then, the solution was filtered through a microfilter made of polyethylene with a pore diameter of 0.01 μm to prepare a resist underlayer film-forming composition.

Preparation Example 5

To 8.25 g of solution containing 2.48 g of the copolymer obtained in Synthesis Example 1, 0.12 g of epoxy resin EPOLEAD GT401 manufactured by DAICEL CORPORATION, 62.40 g of propylene glycol monomethyl ether acetate, and 29.22 g of propylene glycol monomethyl ether were added to obtain a solution. After then, the solution was filtered through a microfilter made of polyethylene with a pore diameter of 0.01 μm to prepare a resist underlayer film-forming composition.

Preparation Example 6

To 7.22 g of solution containing 2.17 g of the copolymer obtained in Synthesis Example 1, 0.43 g of epoxy resin EPOLEAD GT401 manufactured by DAICEL CORPORATION, 63.12 g of propylene glycol monomethyl ether acetate, and 29.22 g of propylene glycol monomethyl ether were added to obtain a solution. After then, the solution was filtered through a microfilter made of polyethylene with a pore diameter of 0.01 μm to prepare a resist underlayer film-forming composition.

Preparation Example 7

To 7.22 g of solution containing 2.17 g of the copolymer obtained in Synthesis Example 1, 0.43 g of epoxy resin TEPIC-VL manufactured by NISSAN CHEMICAL INDUSTRIES, LTD., 63.12 g of propylene glycol monomethyl ether acetate, and 29.22 g of propylene glycol monomethyl ether were added to obtain a solution. After then, the solution was filtered through a microfilter made of polyethylene with a pore diameter of 0.01 μm to prepare a resist underlayer film-forming composition.

Preparation Example 8

To 8.67 g of solution containing 2.60 g of the copolymer obtained in Synthesis Example 3, 68.18 g of propylene glycol monomethyl ether acetate and 23.15 g of cyclohexanone were added to obtain a solution. After then, the solution was filtered through a microfilter made of polyethylene with a pore diameter of 0.01 μm to prepare a resist underlayer film-forming composition.

Preparation Example 9

To 3.56 g of solution containing 1.07 g of the polymer obtained in Synthesis Example 5, 7.11 g of solution containing 2.13 g of the polymer obtained in Synthesis Example 6, 60.29 g of propylene glycol monomethyl ether acetate, and 29.04 g of ethyl lactate were added to obtain a solution. After then, the solution was filtered through a microfilter made of polyethylene with a pore diameter of 0.01 μm to prepare a resist underlayer film-forming composition.

Preparation Example 10

To 13.73 g of solution containing 2.80 g of the copolymer obtained in Synthesis Example 4, 0.69 g of tetramethoxymethyl glycoluril [POWDERLINK (registered trademark) 1174 manufactured by Nihon Cytec Industries Inc.], 0.07 g of pyridinium p-toluenesulfonic acid, 56.57 g of propylene glycol monomethyl ether, and 28.95 g of propylene glycol monomethyl ether acetate were added to obtain a solution. After then, the solution was filtered through a microfilter made of polyethylene with a pore diameter of 0.01 μm to prepare a resist underlayer film-forming composition.

Example 1

The resist underlayer film-forming composition prepared in Preparation Example 1 was applied to a silicon substrate by spin coating under conditions of 1,900 rpm and 60 seconds, and baked at 220° C. for 60 seconds to prepare a coating film with a thickness of 60 nm.

Example 2

The resist underlayer film-forming composition prepared in Preparation Example 1 was applied to a silicon substrate by spin coating under conditions of 1,100 rpm and 60 seconds, and baked at 220° C. for 60 seconds to prepare a coating film with a thickness of 80 nm.

Example 3

The resist underlayer film-forming composition prepared in Preparation Example 2 was applied to a silicon substrate by spin coating under conditions of 1,900 rpm and 60 seconds, and baked at 220° C. for 60 seconds to prepare a coating film with a thickness of 60 nm.

Example 4

The resist underlayer film-forming composition prepared in Preparation Example 3 was applied to a silicon substrate by spin coating under conditions of 1,900 rpm and 60 seconds, and baked at 220° C. for 60 seconds to prepare a coating film with a thickness of 60 nm.

Example 5

The resist underlayer film-forming composition prepared in Preparation Example 4 was applied to a silicon substrate by spin coating under conditions of 1,900 rpm and 60 seconds, and baked at 220° C. for 60 seconds to prepare a coating film with a thickness of 60 nm.

Example 6

The resist underlayer film-forming composition prepared in Preparation Example 5 was applied to a silicon substrate by spin coating under conditions of 1,900 rpm and 60 seconds, and baked at 220° C. for 60 seconds to prepare a coating film with a thickness of 60 nm.

Example 7

The resist underlayer film-forming composition prepared in Preparation Example 6 was applied to a silicon substrate by spin coating under conditions of 1,900 rpm and 60 seconds, and baked at 220° C. for 60 seconds to prepare a coating film with a thickness of 60 nm.

Example 8

The resist underlayer film-forming composition prepared in Preparation Example 7 was applied to a silicon substrate by spin coating under conditions of 1,900 rpm and 60 seconds, and baked at 220° C. for 60 seconds to prepare a coating film with a thickness of 60 nm.

Example 9

The resist underlayer film-forming composition prepared in Preparation Example 8 was applied to a silicon substrate by spin coating under conditions of 1,900 rpm and 60 seconds, and baked at 220° C. for 60 seconds to prepare a coating film with a thickness of 60 nm.

Example 10

The resist underlayer film-forming composition prepared in Preparation Example 9 was applied to a silicon substrate by spin coating under conditions of 1,900 rpm and 60 seconds, and baked at 260° C. for 60 seconds to prepare a coating film with a thickness of 60 nm.

Comparative Example 1

The resist underlayer film-forming composition prepared in Preparation Example 10 was applied to a silicon substrate by spin coating under conditions of 1,900 rpm and 60 seconds, and baked at 220° C. for 60 seconds to prepare a coating film with a thickness of 60 nm.

(Elution Test into Photoresist Solvent)

The coating film prepared in each of Examples 1 to 10 was immersed in OK73 thinner (manufactured by TOKYO OHKA KOGYO CO., LTD., mixture of propylene glycol monomethyl ether and propylene glycol monomethyl ether acetate) as a solvent used in application of photoresist for 1 minute. A change in thickness of the resist underlayer film before and after the immersion was confirmed to be 1 nm or less. The result shows that a resist can be laminated on an upper layer of the coating film prepared in each of Examples 1 to 10.

(Elution Test into Resist Developer)

The coating film prepared in each of Examples 1 to 10 was immersed in NMD-3 (manufactured by TOKYO OHKA KOGYO CO., LTD.) as a developer used in photoresist development for 1 minute. A change in thickness of the resist underlayer film before and after the immersion was confirmed to be 1 nm or less.

(Resistance Test to Basic Aqueous Hydrogen Peroxide Solution)

The coating film prepared in each of Examples 1 to 10 was immersed in chemical solutions A and B as a basic aqueous hydrogen peroxide solution having a composition shown in Table 1 at a temperature shown in Table 1 for 12 minutes, washed with water, and dried. The state of the resist underlayer film was visually observed. The results are shown in Table 2. In Table 2, "○" shows a state in which separation of the coating film is not observed, and "x" shows a state in which separation of a part or all of the coating film is observed.

TABLE 1

Composition and Treatment Temperature of Basic Aqueous Hydrogen Peroxide Solution

| | 28% by mass aqueous ammonia solution | 33% by mass aqueous hydrogen peroxide solution | Water | Temperature |
|---|---|---|---|---|
| Chemical solution A | 40 mL | 25 mL | 650 mL | 50° C. |
| Chemical solution B | 25 mL | 100 mL | 500 mL | 65° C. |

TABLE 2

| | Chemical solution A | Chemical solution B |
|---|---|---|
| Example 1 | ○ | ○ |
| Example 2 | ○ | ○ |
| Example 3 | ○ | ○ |
| Example 4 | ○ | ○ |
| Example 5 | ○ | ○ |
| Example 6 | ○ | ○ |
| Example 7 | ○ | ○ |
| Example 8 | ○ | ○ |
| Example 9 | ○ | ○ |
| Example 10 | ○ | ○ |
| Comparative Example 1 | X | X |

As shown from the results in Table 2, the coating films prepared in Examples 1 to 10 have sufficient resistance to the basic aqueous hydrogen peroxide solution.

The invention claimed is:

1. A pattern forming method comprising:
    a first step of applying a resist underlayer film-forming composition containing a solvent and a polymer having a weight average molecular weight of 1,000 to 100,000 and an epoxy group on a semiconductor substrate that may have an inorganic film on the surface, followed by baking, to form a resist underlayer film;
    a second step of forming a resist pattern on the resist underlayer film;
    a third step of dry etching the resist underlayer film using the resist pattern as a mask to expose a surface of the inorganic film or the semiconductor substrate; and
    a fourth step of wet etching the inorganic film or the semiconductor substrate using the dry-etched resist underlayer film as a mask and a basic aqueous hydrogen peroxide solution.

2. The pattern forming method according to claim 1, wherein the polymer further has a protected carboxyl group.

3. The pattern forming method according to claim 1, wherein the polymer further has an absorption moiety exhibiting absorption at a wavelength of 193 nm or an absorption moiety exhibiting absorption at a wavelength of 248 nm.

4. The pattern forming method according to claim 1, wherein the resist underlayer film-forming composition further contains one or two or more of polymers selected from the group consisting of a polymer having a protected carboxyl group, a polymer having an absorption moiety exhibiting absorption at a wavelength of 193 nm, and a polymer having an absorption moiety exhibiting absorption at a wavelength of 248 nm.

5. The pattern forming method according to claim 1, wherein the resist underlayer film-forming composition further contains as a crosslinker, a compound having one or two or more groups selected from the group consisting of an epoxy group, an oxetanyl group, a carboxyl group, a thiol group, and a phenyl group.

6. The pattern forming method according to claim 1, wherein the inorganic film includes one or two or more selected from the group consisting of a polysilicon film, a silicon oxide film, a silicon nitride film, a BPSG film, a titanium nitride film, a titanium oxynitride film, a tungsten film, a gallium nitride film, and a gallium arsenide film.

7. The pattern forming method according to claim 1, wherein the basic aqueous hydrogen peroxide solution contains ammonia, sodium hydroxide, potassium hydroxide, sodium cyanide, potassium cyanide, triethanolamine, or urea.

8. The pattern forming method according to claim 1, wherein the basic aqueous hydrogen peroxide solution is a mixture of 25% by mass to 30% by mass of aqueous ammonia solution (A), 30% by mass to 36% by mass of aqueous hydrogen peroxide solution (B), and water (C), and the volume ratio (B)/(A) of the aqueous hydrogen peroxide solution (B) to the aqueous ammonia solution (A) is 0.1 to 20.0, and the volume ratio (C)/(A) of water (C) to the aqueous ammonia solution (A) is 5.0 to 50.0.

* * * * *